(12) United States Patent
Oh et al.

(10) Patent No.: US 10,005,092 B2
(45) Date of Patent: Jun. 26, 2018

(54) NOZZLE AND SUBSTRATE TREATING APPARATUS INCLUDING THE SAME

(71) Applicant: Semes Co., Ltd., Chungcheongnam-do (KR)

(72) Inventors: Sehoon Oh, Chungcheongnam-do (KR); Kihoon Choi, Chungcheongnam-do (KR); Jinkyu Kim, Busan (KR)

(73) Assignee: SEMES CO., LTD., Chungcheongnam-do (KR)

( * ) Notice: Subject to any disclaimer, the term of this patent is extended or adjusted under 35 U.S.C. 154(b) by 0 days. days.

(21) Appl. No.: 15/223,931

(22) Filed: Jul. 29, 2016

(65) Prior Publication Data

US 2017/0028413 A1 Feb. 2, 2017

(30) Foreign Application Priority Data

Jul. 31, 2015 (KR) .................. 10-2015-0109096

(51) Int. Cl.
| | |
|---|---|
| *B05B 3/00* | (2006.01) |
| *B05C 5/02* | (2006.01) |
| *B05B 7/10* | (2006.01) |
| *B05B 7/06* | (2006.01) |
| *B05B 7/08* | (2006.01) |
| *H01L 21/67* | (2006.01) |

(52) U.S. Cl.
CPC .................. *B05B 7/10* (2013.01); *B05B 7/06* (2013.01); *B05B 7/061* (2013.01); *B05B 7/0815* (2013.01); *B05C 5/0208* (2013.01); *H01L 21/67051* (2013.01)

(58) Field of Classification Search
CPC .......... B05C 5/0208; B05B 3/00; B05B 7/06; B05B 7/061; B05B 7/0815; B05B 7/10; B05B 7/0853; H01L 21/67051; B08B 3/02; B08B 3/028
USPC .... 118/313, 315, 52, 56, 319, 320; 134/153, 134/158, 902; 239/290–301; 427/240
See application file for complete search history.

(56) References Cited

U.S. PATENT DOCUMENTS

| | | | | |
|---|---|---|---|---|
| 4,844,347 A | * | 7/1989 | Konhauser | ............ B05B 7/0815 239/296 |
| 5,178,326 A | * | 1/1993 | Kukesh | ..................... B05B 7/06 239/11 |
| 5,779,162 A | * | 7/1998 | Noakes | ................... B05B 5/053 239/290 |
| 2007/0102841 A1 | * | 5/2007 | Bondeson | ............. B05B 7/0861 264/209.1 |

(Continued)

FOREIGN PATENT DOCUMENTS

| | | |
|---|---|---|
| JP | 4484861 B | 4/2007 |
| JP | 2008114183 | * 5/2008 |

(Continued)

*Primary Examiner* — Laura Edwards
(74) *Attorney, Agent, or Firm* — Jenkins, Wilson, Taylor & Hunt, P.A.

(57) ABSTRACT

A nozzle for supplying a fluid to a substrate, the nozzle including a body having a liquid discharge line through which the liquid flows and a gas discharge line that surrounds the liquid discharge line and through which a gas flow, wherein the body includes a plurality of liquid discharge holes that discharge the liquid flowing through the liquid discharge line, and a gas discharge hole that discharges the gas flowing through the gas discharge line.

20 Claims, 16 Drawing Sheets

(56) References Cited

U.S. PATENT DOCUMENTS

| | | |
|---|---|---|
| 2012/0227770 A1 | 9/2012 | Kaneko et al. |
| 2013/0340796 A1* | 12/2013 | Kawano ............ H01L 21/02057 134/28 |
| 2014/0196749 A1* | 7/2014 | Tang ................ H01L 21/67051 134/7 |

FOREIGN PATENT DOCUMENTS

| | | |
|---|---|---|
| JP | 2009-088078 A | 4/2009 |
| JP | 2012-015180 A | 1/2012 |
| JP | 2012-190868 A | 10/2012 |
| JP | 2015-167234 A | 9/2015 |
| JP | 2016-163034 A | 9/2016 |
| KR | 10-0602894 B | 12/2004 |
| KR | 10-1486165 B | 11/2013 |
| KR | 10-2015-0048067 A | 5/2015 |

* cited by examiner

NOZZLE AND SUBSTRATE TREATING APPARATUS INCLUDING THE SAME

CROSS-REFERENCE TO RELATED APPLICATIONS

A claim for priority under 35 U.S.C. §119 is made to Korean Patent Application No. 10-2015-0109096 filed Jul. 31, 2015, in the Korean Intellectual Property Office, the entire content of which is incorporated by reference herein.

BACKGROUND

The disclosure herein relates to a nozzle and a substrate treating apparatus including the same, and more particularly to a two-fluid nozzle and a substrate treating apparatus including the same.

Contaminants such as particles, organic contaminants, and metallic contaminants on a surface of a substrate greatly influence the characteristics and yield rate of a semiconductor device. Due to this, a cleaning process of removing various contaminants attached to a surface of a substrate is very important, and a process of cleaning a substrate is performed before and after unit processes for manufacturing a semiconductor. In general, a process of cleaning a substrate includes a chemical treating process of removing metallic substances, organic substances, and particles residing on a substrate by using a treatment liquid such as a chemical, a rinsing process of removing the chemical residing on the substrate by using pure water, and a drying process of drying the substrate by using a drying gas.

A nozzle is selected according to an object, which is to be cleaned, in a cleaning process. Nozzles are classified into a type of dropping a chemical to inject the chemical and a two-fluid type of injecting gas to a chemical to inject the chemical in the form of mist. In the two-fluid type, a two-fluid nozzle according to the related art is illustrated in FIGS. 17 and 18. Referring to FIGS. 17 and 18, a liquid discharge hole 1000 from which a liquid is discharged has a single passage to form a thick liquid column. The liquid is not sufficiently atomized even though the gas discharged from the gas discharge hole 2000 collides with the gas. Accordingly, due to the droplets having large sizes damage the patterns of the substrate. Further, because the liquid column is relatively thick, the sizes of the droplets are different and uneven even though the gas collides with the liquid to atomize the liquid. Accordingly, the dispersion of the liquid dropping to the substrate is unbalanced. Accordingly, the pattern of the substrate is damaged and the cleaning becomes uneven, deteriorating the cleaning efficiency.

SUMMARY

The disclosure herein provides a nozzle that can prevent damage to a pattern of a substrate by reducing a dispersion of droplets in a two-fluid nozzle and can improve cleaning efficiency, and a substrate treating apparatus.

The aspect of the disclosure herein is not limited thereto, and other unmentioned aspects of the disclosure herein may be clearly appreciated by those skilled in the art from the following descriptions.

The disclosure herein provides a nozzle.

In accordance with an aspect of the disclosure herein, there is provided a nozzle for supplying a fluid to a substrate, the nozzle including a body having a liquid discharge line through which the liquid flows and a gas discharge line that surrounds the liquid discharge line and through which a gas flow, wherein the body includes a plurality of liquid discharge holes that discharge the liquid flowing through the liquid discharge line, and a gas discharge hole that discharges the gas flowing through the gas discharge line.

According to an embodiment, the liquid discharge holes may be combined to surround a central axis of the liquid discharge line.

According to an embodiment, the gas discharge line may include an outlet line through which the gas is discharged to the outside, and the outlet line may be inclined downwards in a direction that faces the central axis of the liquid discharge line.

According to an embodiment, the gas discharge line may further include an inlet line through which the gas is introduced, and a middle line that connects the inlet line and the outlet line, and the inlet line may be inclined downwards in a direction that faces the central axis of the liquid discharge line.

According to an embodiment, a cross-sectional area of the outlet line may become wider as it goes downwards.

According to an embodiment, an inner surface of the outlet line may form an acute angle with respect to the central axis of the liquid discharge line.

According to an embodiment, an inner surface of the outlet line may form an angle of 60 to 70 degrees with respect to the central axis of the liquid discharge line.

According to an embodiment, an outer surface of the outlet line may extend from an outer surface of the middle line in the same direction.

According to an embodiment, the outer surface of the outlet line may be parallel to the central axis of the liquid discharge line.

According to an embodiment, the liquid discharge hole and the gas discharge hole may be spaced apart from each other, and a distance between the liquid discharge hole and the gas discharge hole may be not more than 0.5 mm.

According to an embodiment, a diameter of the liquid discharge hole may be not more than 500 μm.

According to an embodiment, the liquid discharge hole has a circular shape, and the gas discharge hole has an annular ring shape.

According to an embodiment, the nozzle may further include a buffer that prevents the gas from being discharged while being biased, the buffer may include a flange that protrudes from an outer surface of the liquid discharge line, and a plurality of grooves that are vertically formed along a circumference of the flange, and the grooves may be inclined from an outer peripheral surface of the flange to the inside of the flange, and is inclined downwards with a vertical direction of the flange.

In accordance with another aspect of the disclosure herein, there is provided an apparatus for treating a substrate, the apparatus including a cup that provides a treatment space for treating the substrate, a support unit that is provided in the treatment space to support the substrate in the treatment space, and an injection unit that has a nozzle for discharging a fluid to the substrate, the nozzle may include a body having a liquid discharge line through which the liquid flows and a gas discharge line that surrounds the liquid discharge line and through which a gas flow, and the body may include a plurality of liquid discharge holes that discharge the liquid flowing through the liquid discharge line, and a gas discharge hole that discharges the gas flowing through the gas discharge line.

According to an embodiment, the liquid discharge holes may be combined to surround a central axis of the liquid discharge line.

According to an embodiment, the gas discharge line may include an outlet line through which the gas is discharged to the outside; the outlet line may be inclined downwards in a direction that faces the central axis of the liquid discharge line.

According to an embodiment, the gas discharge line may further include an inlet line through which the gas is introduced, and a middle line that connects the inlet line and the outlet line, and the inlet line may be inclined downwards in a direction that faces the central axis of the liquid discharge line.

According to an embodiment, a cross-sectional area of the outlet line may become wider as it goes downwards.

According to an embodiment, an inner surface of the outlet line may be inclined at an acute angle with respect to a central axis of the liquid discharge line.

According to an embodiment, an inner surface of the outlet line may form an angle of 60 to 70 degrees with respect to the central axis of the liquid discharge line to be inclined downwards.

According to an embodiment, an outer surface of the outlet line may extend from an outer surface of the middle line in the same direction.

According to an embodiment, the outer surface of the outlet line may be parallel to the central axis of the liquid discharge line.

According to an embodiment, the liquid discharge hole and the gas discharge hole may be spaced apart from each other, and a distance between the liquid discharge hole and the gas discharge hole may be not more than 0.5 mm.

According to an embodiment, a diameter of the liquid discharge hole may be not more than 500 μm.

According to an embodiment, the liquid discharge hole may have circular shape, and the gas discharge hole has an annular ring shape.

According to an embodiment, the nozzle may further include a buffer that prevents the gas from being discharged while being biased, the buffer may include a flange that protrudes from an outer surface of the liquid discharge line, and a plurality of grooves that are vertically formed along a circumference of the flange, and the grooves may be inclined from an outer peripheral surface of the flange to the inside of the flange, and is inclined downwards with a vertical direction of the flange.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, exemplary embodiments of the disclosure herein will be described in more detail with reference to the accompanying drawings. The embodiments of the disclosure herein may be modified in various forms, and the scope of the disclosure herein should not be construed to be limited to the following embodiments. The embodiments of the disclosure herein are provided to describe the disclosure herein for those skilled in the art more completely. Accordingly, the shapes of the components of the drawings are exaggerated to emphasize clearer description thereof.

Hereinafter, exemplary embodiments of the disclosure herein will be described with reference to FIGS. 1 through 16.

Figure 1:
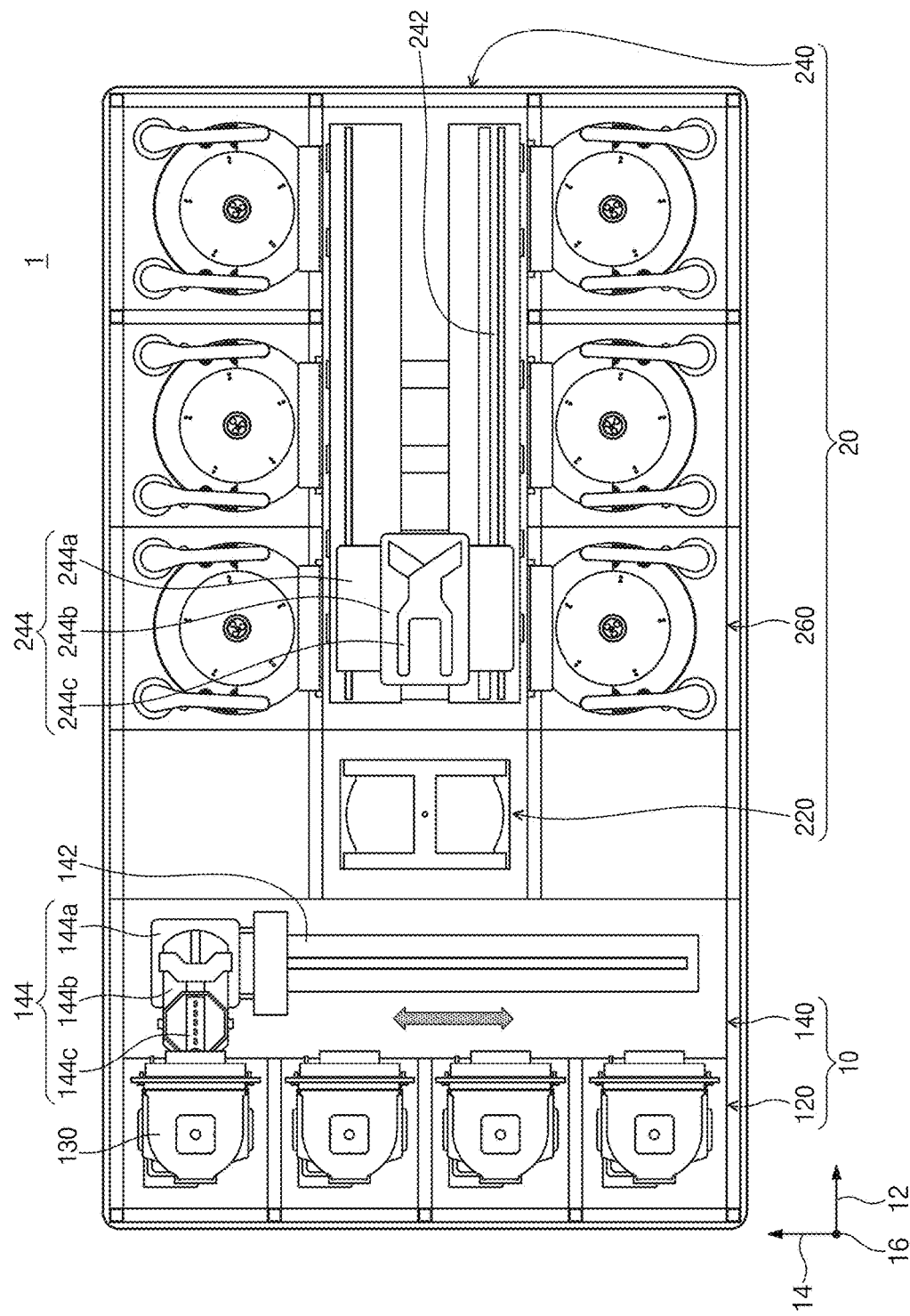
FIG. 1 is a plan view schematically illustrating a substrate treating system according to the disclosure herein.

FIG. 1 is a plan view schematically illustrating a substrate treating system 1.

Referring to FIG. 1, the substrate treating system 1 includes an index module 100 and a process executing module 200. The index module 100 includes a plurality of load ports 120 and a feeding frame 140. The load port 120, the feeding frame 140, and the process treating module 200 may be sequentially arranged in a row. Hereinafter, a direction in which the load port 120, the feeding frame 140, and the process treating module 200 will be referred to as a first direction 12. A direction perpendicular to the first direction 12 when viewed from the top will be referred to as a second direction 14, and a direction normal to a plane including the first direction 12 and the second direction 14 will be referred to as a third direction 16.

A carrier 130, in which a substrate W is received, is seated on the load port 120. A plurality of load ports 120 are provided, and are arranged along the second direction 14 in a row. FIG. 1 illustrates that four load ports 120 are provided. However, the number of the load ports 120 may increase or decrease according to a condition, such as the process efficiency of the process treating module 200 or a footprint. A plurality of slots (not illustrated) provided to support peripheries of substrates W are formed in the carrier 130. A plurality of slots are provided in the third direction 16. The substrates W are stacked in the carrier 130 while being spaced apart from each other along the third direction 16. A front opening unified pod (FOUP) may be used as the carrier 130.

The process treating module 200 includes a buffer unit 220, a feeding chamber 240, and a plurality of process chambers 260. The feeding chamber 240 is arranged such that the lengthwise direction thereof is in parallel to the first direction 12. The process chambers 260 are arranged on opposite sides of the feeding chamber 240 along the second direction 14. The process chambers 260 situated on one side of the feeding chamber 240 and the process chambers 260 situated on an opposite side of the feeding chamber 240 are symmetrical to each other with respect to the feeding chamber 240. Some of the process chambers 260 are arranged along the lengthwise direction of the feeding chamber 240. Furthermore, some of the process chambers 260 are arranged to be stacked on each other. That is, the process chambers 260 having an array of A by B (A and B are natural numbers) may be arranged on one side of the feeding chamber 240. Here, A is the number of the process chambers 260 provided in a row along the first direction 12, and B is the number of the process chambers 260 provided in a row along the third direction 16. When four or six process chambers 260 are provided on one side of the feeding chamber 240, the process chambers 260 may be arranged in an array of 2 by 2 or 3 by 2. The number of the process chambers 260 may increase or decrease. Unlike the above-mentioned description, the process chambers 260 may be provided only on one side of the feeding chamber 240. Further, unlike the above-mentioned description, the process chambers 260 may be provided on one side or opposite sides of the feeding chamber 240 to form a single layer.

A buffer unit 220 is arranged between the feeding frame 140 and the feeding chamber 240. The buffer unit 220 provides a space in which the substrates W stay before being transported, between the feeding chamber 240 and the feeding frame 140. Slots (not illustrated) in which the substrates W are positioned are provided in the buffer unit 220, and a plurality of slots (not illustrated) are provided to be spaced apart from each other along the third direction 16. Faces of the buffer unit 220 that faces the feeding frame 140 and faces the feeding chamber 240 are opened.

The feeding frame 140 transports the substrates W between the carrier 130 seated on the load port 120 and the buffer unit 220. An index rail 142 and an index robot 144 are provided in the feeding frame 140. The index rail 142 is arranged such that the lengthwise direction thereof is in parallel to the second direction 14. The index robot 144 is installed on the index rail 142, and is linearly moved in the second direction 14 along the index rail 142. The index robot 144 has a base 144a, a body 144b, and a plurality of index arms 144c. The base 144a is installed to be moved along the index rail 142. The body 144b is coupled to the base 144a. The body 144b is provided to be moved along the third direction 16 on the base 144a. The body 144b is provided to be rotated on the base 144a. The index arms 144c are coupled to the body 144b, and are provided to be moved forwards and rearwards with respect to the body 144b. A plurality of index arms 144c are provided to be driven individually. The index arms 144c are arranged to be stacked so as to be spaced apart from each other along the third direction 16. Some of the index arms 144c are used when the substrates W are transported to the carrier 130 in the process module 200, and some of the index arms 144c may be used when the substrates W are transported from the carrier 130 to the process treating module 200. This structure may prevent particles generated from the substrates W before the process treatment from being attached to the substrates W after the process treatment in the process of carrying the substrates W in and out by the index robot 144.

The feeding chamber 240 transports the substrates W between the buffer unit 220 and the process chambers 260, and between the process chambers 260. A guide rail 242 and a main robot 244 are provided in the feeding chamber 240. The guide rail 242 is arranged such that the lengthwise direction thereof is in parallel to the first direction 12. The main robot 244 is installed on the guide rail 242, and is linearly moved along the first direction 12 on the guide rail 242. The main robot 244 has a base 244a, a body 244b, and a plurality of main arms 244c. The base 244a is installed to be moved along the guide rail 242. The body 244b is coupled to the base 244a. The body 244b is provided to be moved along the third direction 16 on the base 244a. The body 244b is provided to be rotated on the base 244a. The main arms 244c are coupled to the body 244b, and are provided to be moved forwards and rearwards with respect to the body 244b. A plurality of main arms 244c are provided to be driven individually. The main arms 244c are arranged to be stacked so as to be spaced apart from each other along the third direction 16. The main arms 244c used when the substrates W are transported from the buffer unit 220 to the process chambers 260 and the main arms 244 used when the substrates W are transported from the process chambers 260 to the buffer unit 220 may be different.

Substrate treating apparatuses 300 that perform cleaning processes on the substrates W are provided in the process chambers 260. The substrate treating apparatuses 300 provided in the process chambers 260 may have different structures according to the types of performed cleaning processes. Selectively, the substrate treating apparatuses 300 in the process chambers 260 may have the same structure. Selectively, the process chambers 260 may be classified into a plurality of groups such that the substrate treating apparatuses 300 provided in the process chambers 260 pertaining to the same group have the same structure and the substrate treating apparatuses 300 provided in the process chambers 260 pertaining to different groups have different structures. For example, when the process chambers 260 are classified into two groups, the first group of process chambers 260 may be provided on one side of the feeding chamber 240 and the second group of process chambers 260 may be provided on an opposite side of the feeding chamber 240. Selectively, the first group of process chambers 260 may be provided on the lower side of the feeding chamber 240 and the second group of process chambers 260 may be provided on the upper side of the feeding chamber 240, on opposite sides of the feeding chamber 240. The first group of process chambers 260 and the second group of process chambers 260 may be classified according to the kinds of the used chemicals or the types of cleaning methods.

Figure 2:
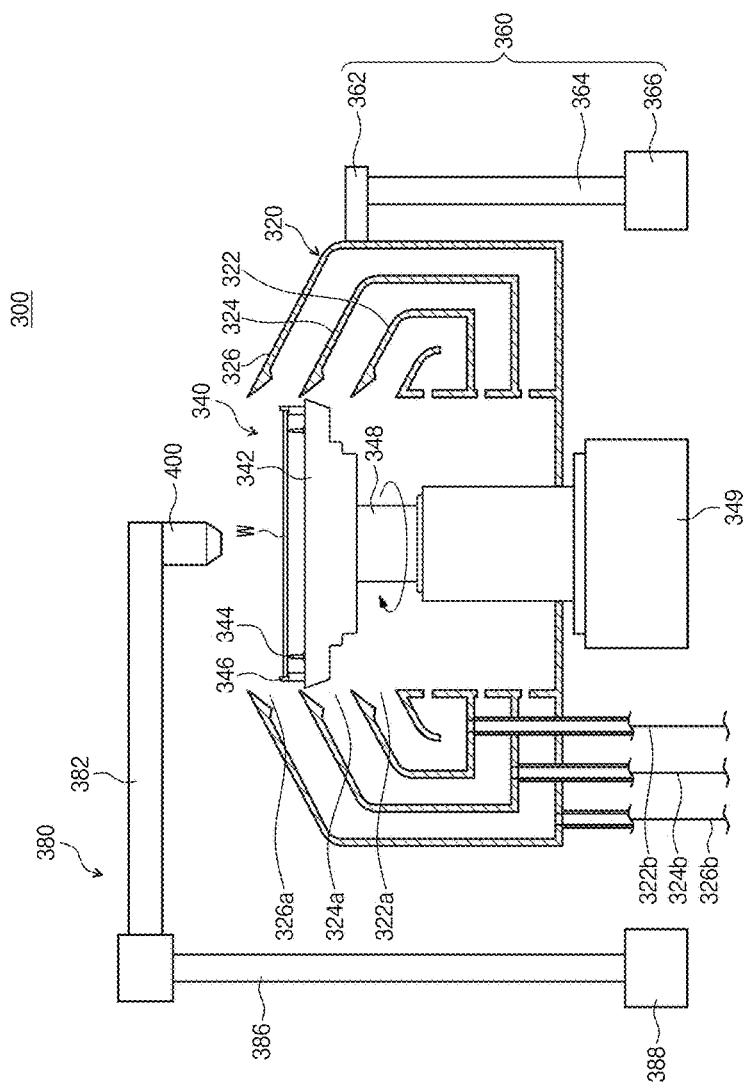
FIG. 2 is a view illustrating an embodiment of a substrate treating apparatus of FIG. 1.

Hereinafter, an example of a substrate treating apparatus 300 that treats a substrate W will be described. FIG. 2 is a schematic view illustrating an example of the substrate treating apparatus 300.

Referring to FIG. 2, the substrate treating apparatus 300 includes a cup 320, a support unit 340, an elevation unit 360, and an injection unit 380. The cup 320 has a space for performing a substrate treating process, and an upper side of the cup 320 is opened. The cup 320 has an inner recovery vessel 322, an intermediate recovery vessel 324, and an outer recovery vessel 326. The recovery vessels 322, 324, and 326 recover different treatment fluids used in the process. The inner recovery vessel 322 has an annular ring shape that surrounds the support unit 340, the intermediate recovery vessel 324 has an annular ring shape that surrounds the inner recovery vessel 322, and the outer recovery vessel 326 has an annular ring shape that surrounds the intermediate recovery vessel 324. An inner space 322a of the inner recovery vessel 322, a space 324a between the inner recovery vessel 322 and the intermediate recovery vessel 324, and a space 326a between the intermediate recovery vessel 324 and the outer recovery vessel 326 function as inlets through which the treatment fluids are introduced into the inner recovery vessel 322, the intermediate recovery vessel 324, and the outer recovery vessel 326. Recovery lines 322b, 324b, and 326b extending from the recovery vessels 322, 324, and 326 perpendicularly in the downward direction of the bottom surfaces thereof are connected to the recovery vessels 322, 324, and 326, respectively. The recovery lines 322b, 324b, and 326b discharge the treatment fluids introduced through the recovery vessels 322, 324, 326, respectively. The discharged treatment fluids may be reused through an external treatment fluid recycling system (not illustrated).

The support unit 340 is arranged in a treatment space of the cup 320. The support unit 340 supports and rotates the substrate during the process. The support unit 340 has a spin head 342, a plurality of support pins 344, a plurality of chuck pins 346, a drive shaft 348, and a driver 349. The spin head 342 has an upper surface having a substantially circular shape when viewed from the top. The drive shaft 348 that may be rotated by a driver 349 is fixedly coupled to the bottom of the spin head 342. If the driving shaft 348 is rotated, the spin head 342 is rotated. The spin head 342 includes a support pin 344 and a chuck pin 346 to support the substrate. A plurality of support pins 344 are provided. The support pins 344 may be arranged to be spaced apart from each other at a periphery of the upper surface of the spin head 342 and protrude upwards from the spin head 342. The support pins 344 are arranged to have a generally annular ring shape through combination thereof. The support pins 344 support a periphery of a bottom surface of the substrate such that the substrate is spaced apart from the upper surface of the spin head 342 by a predetermined distance. A plurality of chuck pins 346 are provided. The chuck pins 346 are arranged to be more distant from the center of the spin head 342 than the support pins 344. The chuck pins 346 are provided to protrude upwards from the spin head 342. The chuck pins 346 support a side surface of the substrate such that the substrate is not separated laterally from a proper place when the support unit 340 is rotated. The chuck pins 346 are provided to be linearly moved between a standby position and a support position along a radial direction of the spin head 342. The standby position is a position that is more distant from the center of the spin head 342 than the support position. When the substrate is loaded on or unloaded from the support unit 340, the chuck pins 346 are located at the standby position, and when a process is performed on the substrate, the chuck pins 346 are located at the support position. The chuck pins 346 are in contact with the side of the substrate at the support position.

The elevation unit 360 linearly moves the cup 320 upwards and downwards. The elevation unit 360 may move the plurality of recovery vessels 322, 324, and 326 of the cup 320. Although not illustrated, the recovery vessels may be individually moved. When the cup 320 is moved upwards and downwards, a relative height of the cup 320 to the support unit 340 is changed. The elevation unit 360 has a bracket 362, a movable shaft 364, and a driver 366. The bracket 362 is fixedly installed on an outer wall of the cup 320, and the movable shaft 364 that is moved upwards and downwards by the driver 366 is fixedly coupled to the bracket 362. The cup 320 is lowered such that, when the substrate W is positioned on the support unit 340 or is lifted from the support unit 340, the support unit 340 protrudes to the upper side of the cup 320. When the process is performed, the height of the cup 320 is adjusted such that the treatment fluid is introduced into the preset recovery vessel 360 according to the kind of the treatment fluid supplied to the substrate W. For example, the substrate is located at a height corresponding to an interior space 322a of the inner recovery vessel 322 while the substrate is treated by a first treatment fluid. Further, the substrate may be located at a height corresponding to a space 324a between the inner recovery vessel 322 and the intermediate recovery vessel 324 and a space 326a between the intermediate recovery vessel 324 and the outer recovery vessel 326 while the substrate is treated by a second treatment fluid and a third treatment fluid. Unlike those described above, the elevation unit 360 may move the support unit 340, instead of the cup 320, upwards and downwards.

The injection unit 380 injects the treatment fluid onto the substrate W. The treatment fluid may be a chemical. The treatment fluid may be ultra-pure water. The injection unit 380 may be rotated. One or a plurality of injection units 380 may be provided. The injection unit 380 has a nozzle support 382, a support 386, a driver 388, and a nozzle 400. The lengthwise direction of the support 386 is provided along the third direction 16, and the driver 388 is coupled to a lower end of the support 386. The driver 388 rotates and elevates the support 386. The nozzle support 382 is coupled to an end of the support 386, which is opposite to an end of the support 386 coupled to the driver 388, perpendicularly to the support 386. The nozzle 400 is installed on a bottom surface of an end of the nozzle support 382. The nozzle 400 is moved to a process location and a standby location by the driver 388. The process location is a location at which the nozzle 400 is arranged at an vertical upper portion of the cup 320, and the standby location is a location that deviates from the vertical upper portion of the cup 320.

Figure 3:
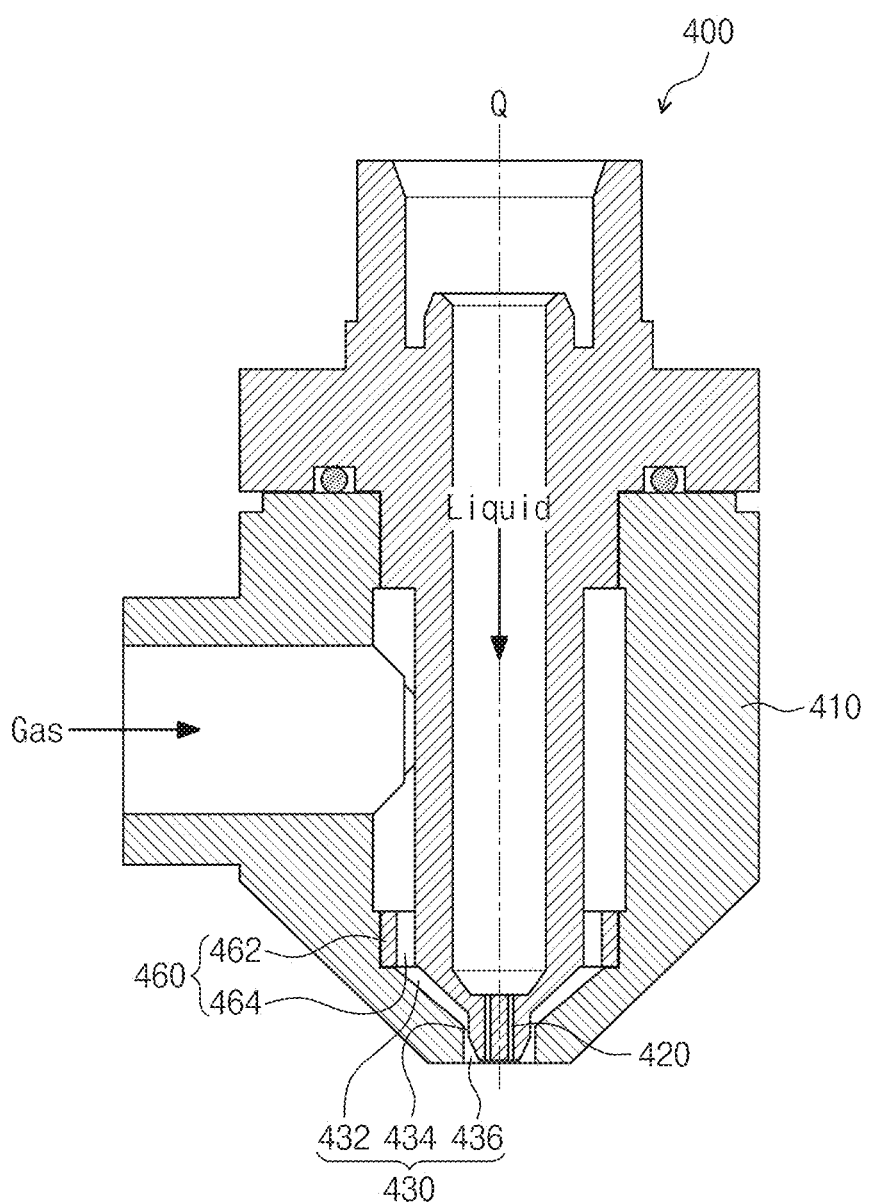
FIG. 3 is a sectional view illustrating a nozzle according to an embodiment of the disclosure herein.
Figure 4:
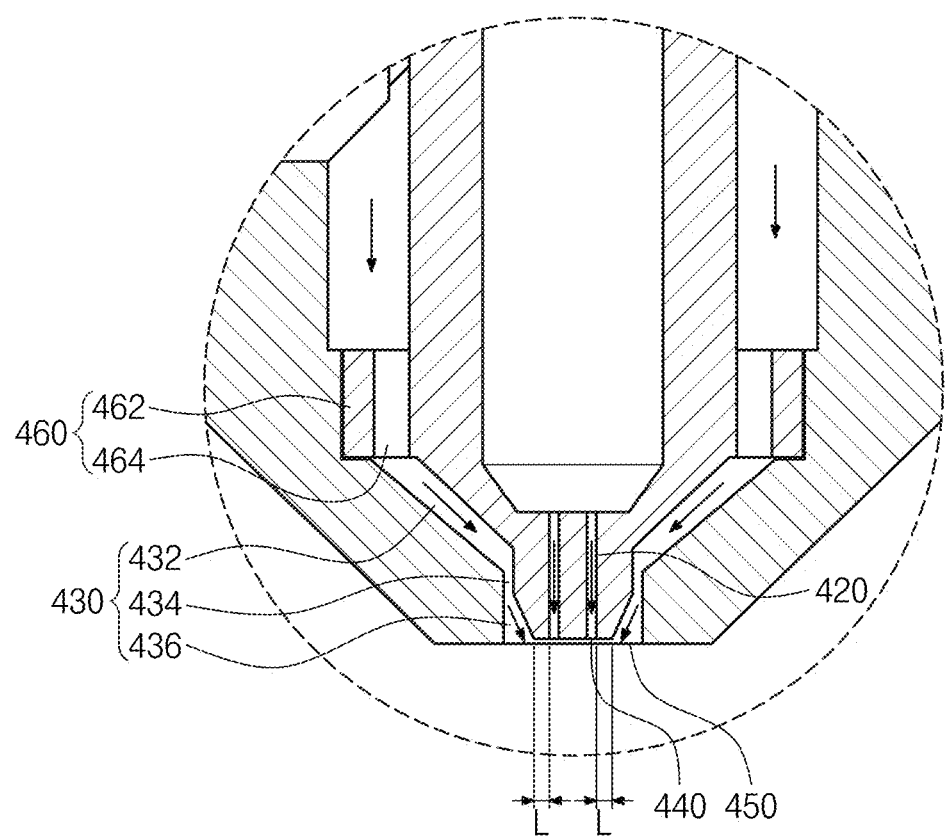
FIG. 4 is an enlarged sectional view illustrating an end of the nozzle of FIG. 3.
Figure 5:
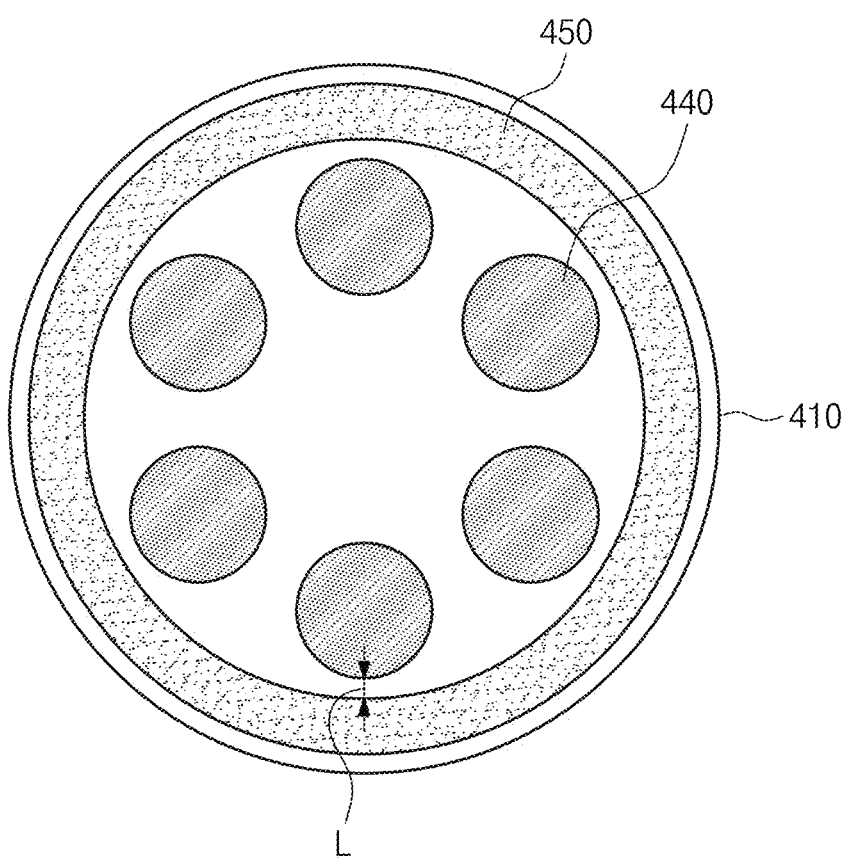
FIG. 5 is a bottom view illustrating an end of the nozzle of FIG. 4.

Hereinafter, a nozzle according to an embodiment of the disclosure herein will be described with reference to FIGS. 3 through 5. FIG. 3 is a sectional view illustrating a nozzle according to an example of the disclosure herein. FIG. 4 is an enlarged sectional view illustrating an end of the nozzle of FIG. 3. FIG. 5 is a bottom view illustrating an end of the nozzle of FIG. 4. The arrow indicates a flow of a gas or a liquid.

The nozzle 400 includes a body 410 and the buffer 460. A liquid discharge line 420 and a gas discharge line 430 are formed in the interior of the body 410. A plurality of liquid discharge holes 440 and a plurality of gas discharge holes 450 are provided at an end of the body 410.

A liquid such as a chemical or a treatment liquid flows through the liquid discharge line 420. The liquid discharge line 420 may be formed vertically along a lengthwise direction of the body 410.

A gas flows through the interior of the gas discharge line 430. The gas may be nitrogen ($N_2$). The gas discharge line 430 may be provided to surround the liquid discharge line 420.

The gas discharge line 430 includes an inlet line 432, an outlet line 436, and a middle line 434. The inlet line 432 is provided to be inclined downwards in a direction that faces a central axis Q of the liquid discharge line 420.

A gas discharge hole 450 is formed at an end of the outlet line 436. The outlet line 436 is provided to be inclined downwards in a direction that faces a central axis Q of the liquid discharge line 420. Accordingly, the gas may be discharged towards droplets that drop from the gas discharge hole 450. The gas may further atomize the droplets. The inlet line 436 and the output line 432 may have the same inclination. The inner surface of the outlet line 436 may form an acute angle with respect to the central axis Q of the liquid discharge line 420. For example, the inner surface of the outlet line 436 may form an angle of 60 to 70 degrees with respect to the central axis Q of the liquid discharge line 420. An outer surface of the outlet line 436 may extend from the outer surface of the middle line 434 in the same direction. The outer surface of the outlet line 436 may be parallel to the central axis Q of the liquid discharge line 420. The outer surface of the outlet line 436 may be perpendicular to an end of the body 410.

Because the inner surface of the discharge line 436 is inclined downwards, and the outer surface of the discharge line 436 is vertically formed, the cross-sectional area of the outlet line 436 becomes wider as it goes downwards. That is, the cross-sectional area of the outlet line 436 becomes wider as it goes towards the gas discharge hole 450. The gas is discharged from the gas discharge hole 450 while being diffused. The gas that has been widely diffused and discharged may further atomize the dropping liquid.

The middle line 434 connects the inlet line 432 and the discharge line 436. The middle line 434 may be formed in a lengthwise direction of the body 410 in the interior of the body 410. The middle line 434 may be provided to be parallel to the liquid discharge line 420.

A liquid such as a treatment liquid or a chemical is discharged from the liquid discharge hole 440. The liquid discharge hole 440 may have a circular shape. A plurality of liquid discharge holes 440 may be provided. The liquid discharge holes 440 may be combined to surround the central axis Q of the liquid discharge line 420. The liquid discharge holes 440 are arranged along a circumference of the gas discharge hole 450.

Figure 6:
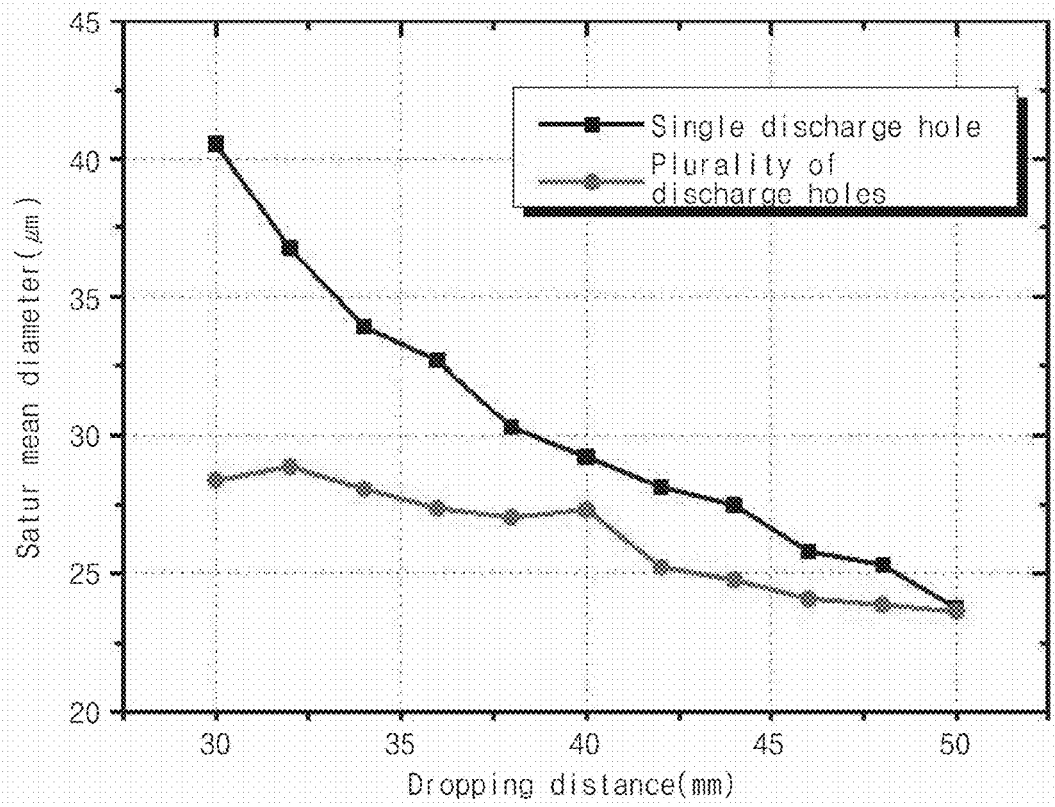
FIGS. 6 and 7 are graphs depicting a comparison of Sauter mean diameters (SMDs) of droplets when a single liquid discharge hole and a plurality of liquid discharge holes are provided.
Figure 7:
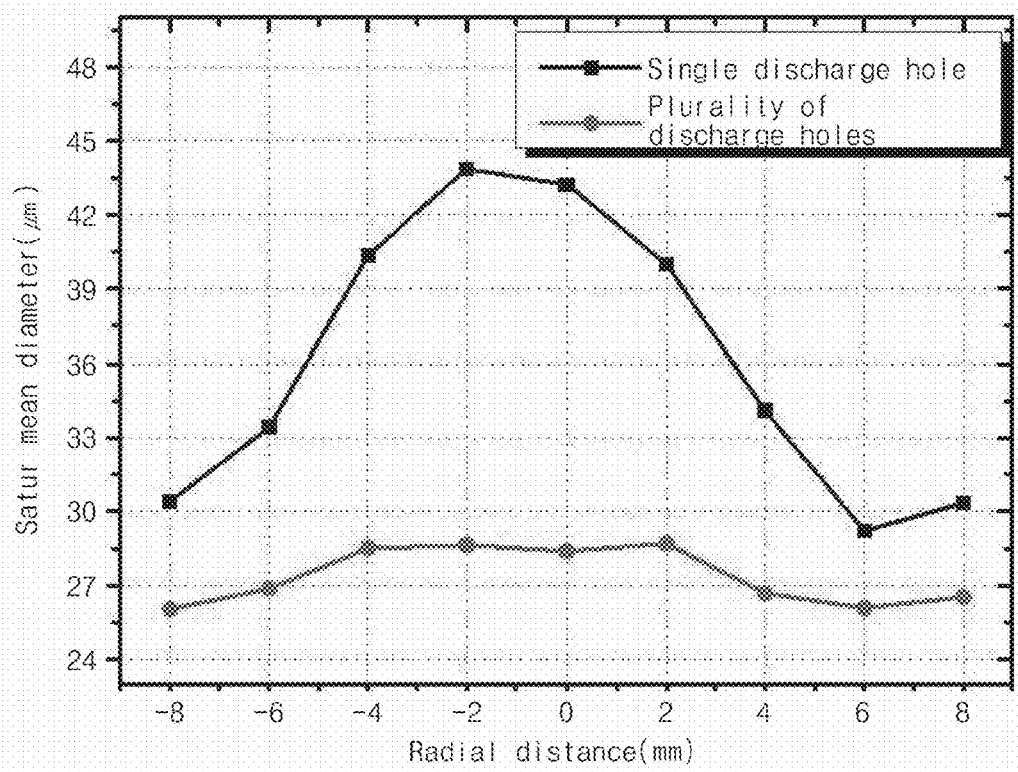

FIGS. 6 and 7 are graphs depicting a comparison of Sauter mean diameters (SMDs) of droplets when a single liquid discharge hole 440 and a plurality of liquid discharge holes 440 are provided.

FIG. 6 depicts diameter of droplets dropping from a single liquid discharge hole and a plurality of liquid discharge holes 440 according to the dropping distances of the droplets. A nozzle having a single liquid discharge hole corresponds to the related art. The diameters of the plurality of liquid discharge holes 440 are smaller than that of the single liquid discharge hole. Accordingly, a liquid column of the liquid discharged from a plurality of liquid discharge holes 440 has a diameter that is smaller than that of a liquid column of the liquid that is discharged from the single liquid discharge hole.

Referring to FIG. 6, as the droplets drop, the SMDs of the droplets that collide with a gas at the single liquid discharge hole is 24 µm to 40 µm. Meanwhile, in the case of the plurality of liquid discharge holes 440, the SMD of the droplets that collide with a gas is not more than 30 µm. Accordingly, the droplets may be atomized. The cleaning efficiency can be improved without damaging a pattern of the substrate.

FIG. 7 depicts the diameters of droplets dropping from a single liquid discharge hole and a plurality of liquid discharge holes 440 according to the radial distances that are horizontal with respect to the central axis Q of the liquid discharge line 420. Referring to FIG. 7, the SMDs in the single liquid discharge hole are mainly not less than 30 µm. Further, the SMDs in a central area of the single liquid discharge hole and the SMDs of a peripheral area of the single liquid discharge hole are 30 µm and 44 µm, respectively, which are greatly different. In this way, the sizes of the droplets become uneven. Meanwhile, in the case of the plurality of liquid discharge holes 440, an average size of the droplets is not more than 30 µm. The sizes of the droplets (SMD) are relatively uniform according to the radial distance in a horizontal direction. Accordingly, the droplets may uniformly atomized, and thus, the cleaning efficiency can be improved without damaging a pattern of the substrate.

Figure 8:
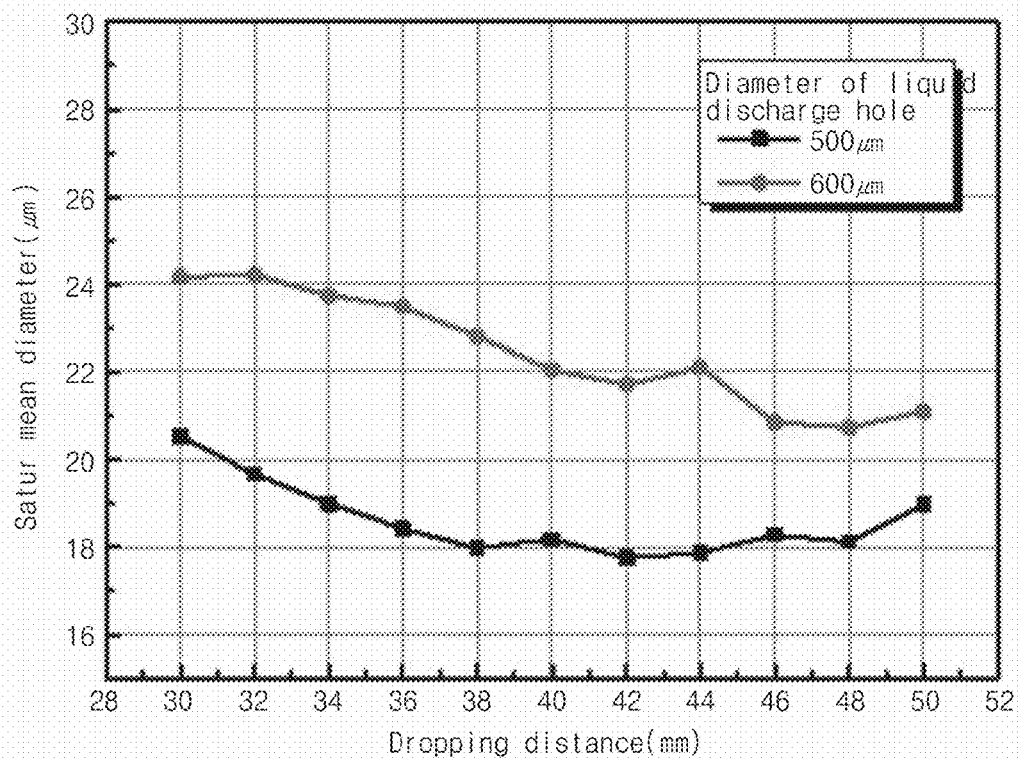
FIG. 8 is a graph depicting an SMD according to the diameter of the liquid discharge hole.

The diameters of the liquid discharge holes 440 may be not more than 500 µm. FIG. 8 is a graph depicting an SMD according to the diameter of the liquid discharge hole 440. When the diameters of the liquid discharge holes 440 are 500 µm and 600 µm, the SMDs according to the distances by which droplets drop are compared.

Referring to FIG. 8, when the diameter of the liquid discharge hole 440 is 600 µm, the SMD is 20 µm to 24 µm. Meanwhile, when the diameter of the liquid discharge hole 440 is 500 µm, the SMD is 18 µm to 20 µm. The droplets may be atomized. Accordingly, damage to the pattern of the substrate may be prevented and cleaning efficiency may be improved.

Referring to FIGS. 3 through 5, a gas is discharged from the gas discharge hole 450. The gas discharge hole 450 may have an annular ring shape. The gas is discharged towards the dropping liquid and atomizes the liquid. A plurality of liquid discharge holes 440 are arranged along a circumference of the gas discharge hole 450. The distances L between the gas discharge hole 450 and the liquid discharge holes 440 may be the same. The distances L refer to the shortest distances between the liquid discharge holes 440 and the gas discharge hole 450. The distances L between the gas discharge hole 450 and the liquid discharge holes 440 may be not more than 0.5 mm. Preferably, the distances L may be 0.1 mm to 0.5 mm.

Figure 9:
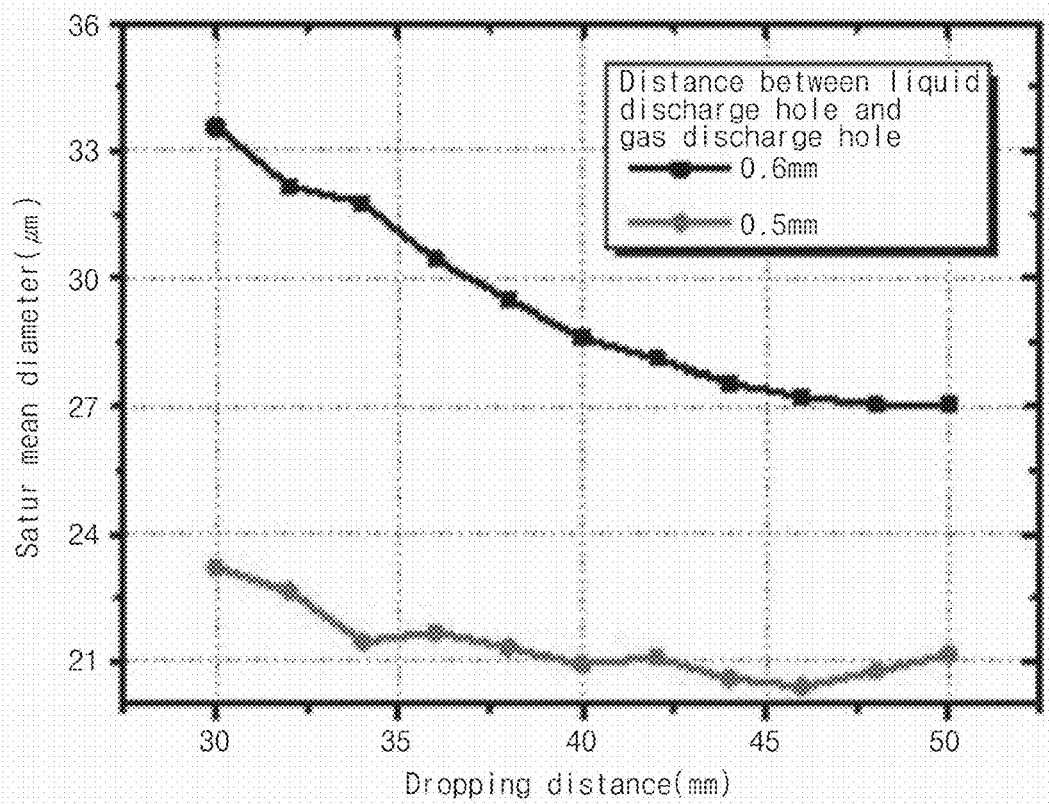
FIGS. 9 and 10 are graphs depicting a comparison of SMDs according to distances between a liquid discharge hole and a gas discharge hole.
Figure 10:
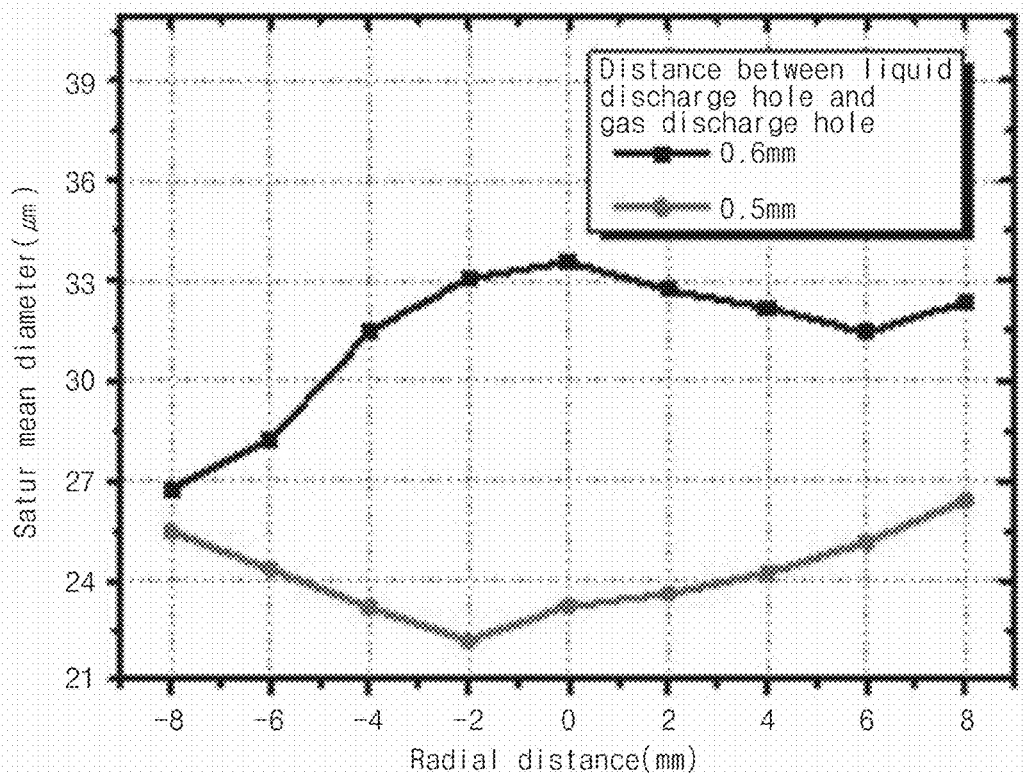

FIGS. 9 and 10 are graphs depicting a comparison of SMDs according to distances between a liquid discharge hole 440 and a gas discharge hole 450.

FIG. 9 compares SMDs according to distances by which droplets drop. When the distance between the liquid discharge hole 440 and the gas discharge hole 450 is 0.6 mm, the size of the SMD is about 27 µm to 33 µm. Meanwhile, when the distance between the liquid discharge hole 440 and the gas discharge hole 450 is 0.5 mm, the size of the SMD is about 21 µm so that the liquid may be atomized. Further, the sizes of the droplets are relatively uniform. Accordingly, damage to a pattern of the substrate can be prevented and cleaning efficiency can be increased.

FIG. 10 compares SMDs according to the radial distances that are horizontal with respect to the central axis Q of the liquid discharge line 420. When the distance between the liquid discharge hole 440 and the gas discharge hole 450 is 0.6 mm, the size of the SMD is about 27 µm to 33 µm. When the distance between the liquid discharge hole 440 and the gas discharge hole 450 is 0.5 mm, the size of the SMD is about 24 µm so that the liquid may be atomized. Further, the sizes of the droplets are relatively uniform. Accordingly, damage to a pattern of the substrate can be prevented and cleaning efficiency can be increased.

Figure 11:
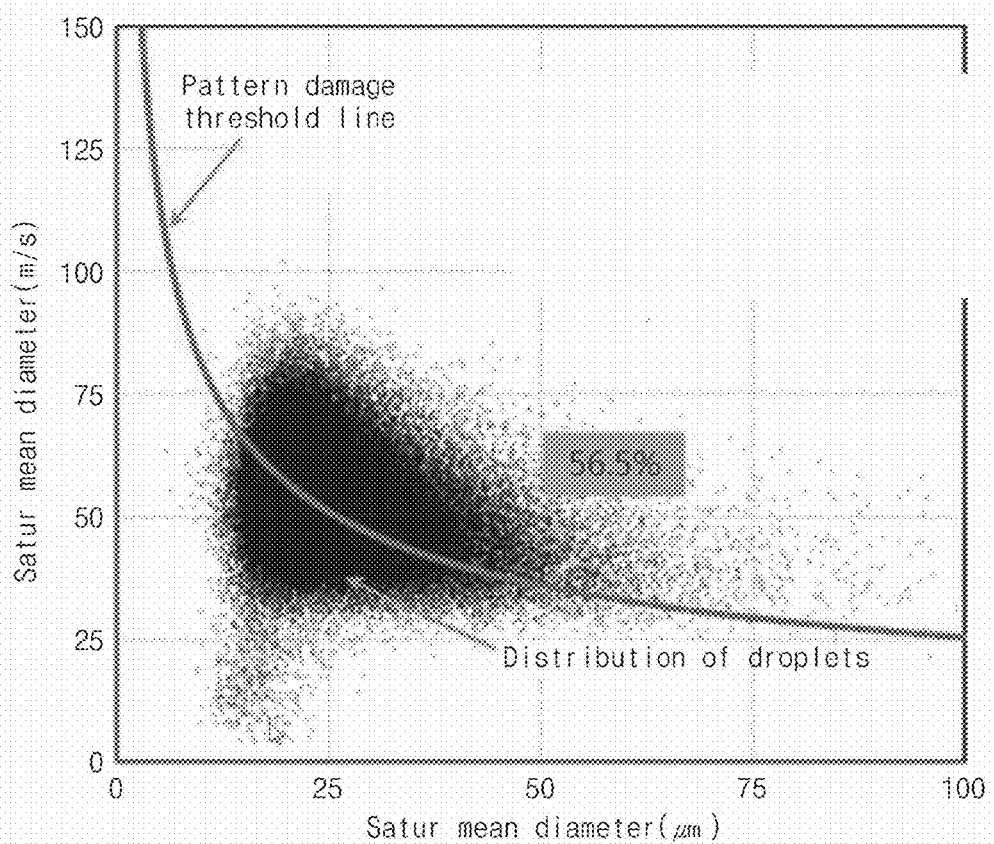
FIGS. 11 and 12 are distribution view illustrating a dispersion of droplets that may damage a pattern of a substrate.
Figure 12:
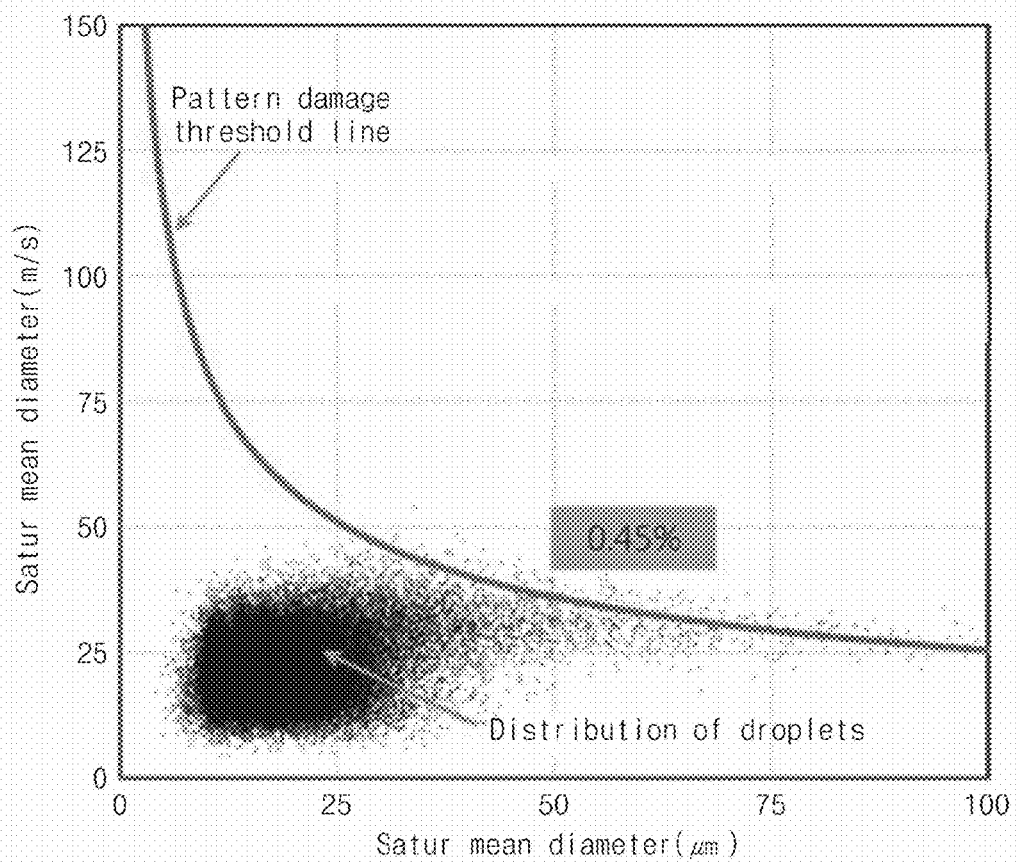

FIGS. 11 and 12 are distribution view illustrating a dispersion of droplets that may damage a pattern of a substrate. The pattern damage threshold line indicates a threshold line of distribution of droplets that damage the pattern of the substrate. The droplets distributed on the lower side of the threshold line do not damage the pattern of the substrate, and the droplets distributed on the upper side of the threshold line damage the pattern of the substrate. That is, the sizes (SMD) of the droplets are large and the dropping speed of the droplets is fast, the pattern of the substrate may be damaged.

FIG. 11 illustrates distribution of droplets that damage a pattern when a nozzle has a single liquid discharge hole 440 according to the related art. The droplets situated on the upper side of the pattern damage threshold line, that is, which damage a pattern of the substrate show a distribution of about 56.5%. Then, the SMD is about 26 μm. Further, the standard deviation of the distribution of the droplets has a wide dispersion of 8 μm. The wide dispersion means that the droplets of uneven sizes drop at uneven speeds. Accordingly, the pattern of the substrate is damaged and cleaning efficiency deteriorates.

FIG. 12 illustrates distribution of droplets that damage a pattern when a nozzle has a plurality of liquid discharge holes 440 according to the disclosure herein. The nozzle has six liquid discharge holes 440, the distance between the liquid discharge holes 440 and the gas discharge hole 450 is 0.18 mm, and the diameter of the liquid discharge holes 440 is 250 μm. Referring to FIG. 12, the droplets may be atomized and the dropping speed of the droplets becomes slower. The distribution of the droplets that damage the pattern of the substrate becomes as low as about 0.45%. Then, the SMD is 15 μm and the standard deviation is 4 μm. This is a value that is increased by about 50% as compared with the nozzle having a single liquid discharge hole 440 of FIG. 11. The dispersion of droplets is narrower than that of the case in which the discharge hole 440 is single, the droplets having a uniform size drop at a uniform speed. Accordingly, damage to the pattern of the substrate may be prevented and cleaning efficiency may be improved.

Figure 13:
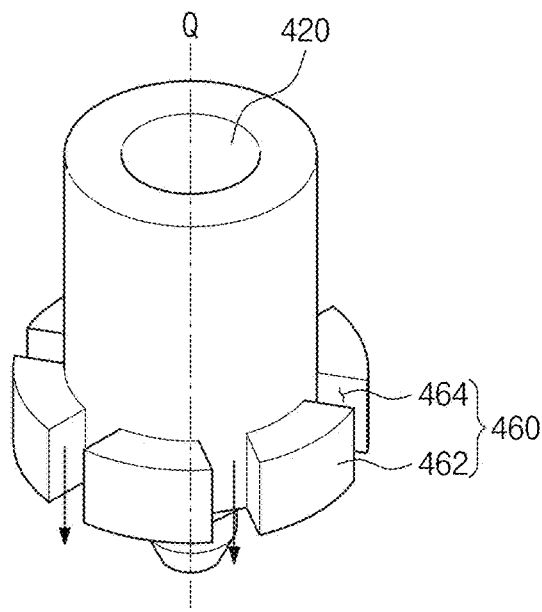
FIGS. 13 and 14 are perspective view illustrating a buffer of a nozzle.
Figure 14:
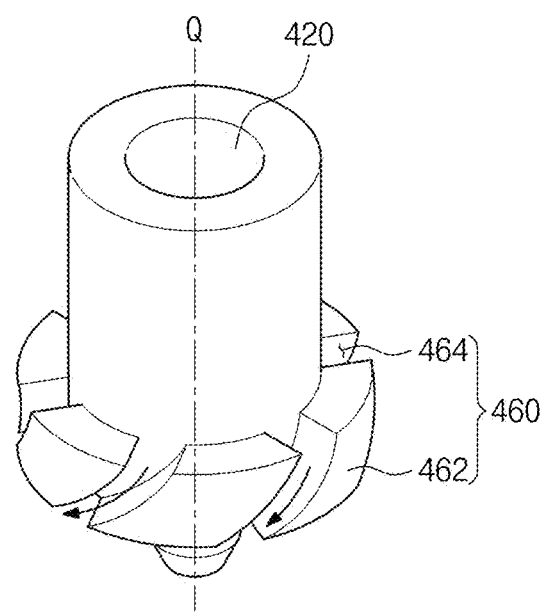
Figure 15:
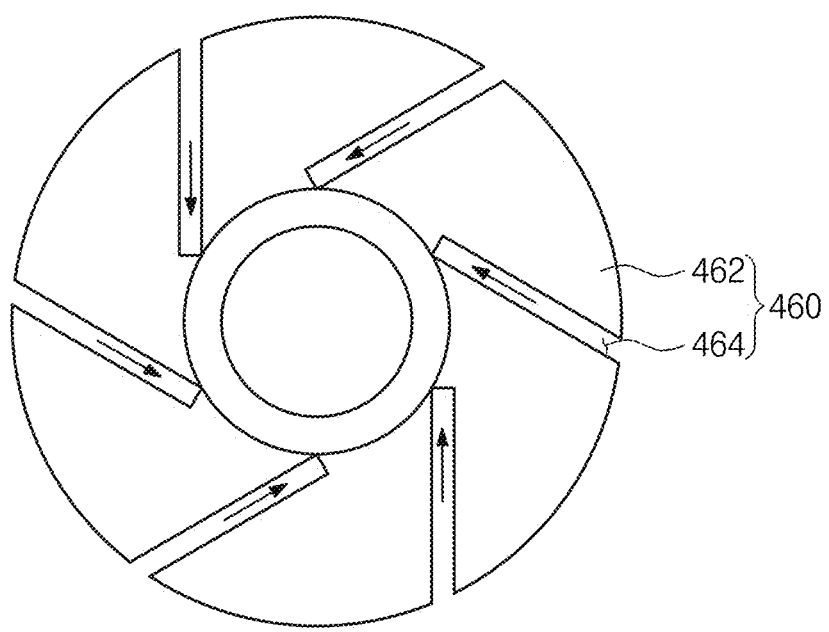
FIG. 15 is a plan view illustrating a buffer.

FIGS. 13 and 14 are perspective views illustrating a buffer 460 of a nozzle 400. FIG. 15 is a plan view illustrating a buffer 460. The arrow indicates a flow of a gas.

The buffer 460 prevents a gas from being discharged while being biased. The buffer 460 is provided in the interior of the body 410. The buffer 460 may be provided in the interior of the gas discharge line 430. If the gas is discharged while being biased, the dropping liquid may be uniformly atomized. Accordingly, it is preferable that the gas discharged from the gas discharge holes 450 is not biased to one side and is uniformly discharged.

The buffer 460 includes a flange 462 and a groove 464. The flange 462 protrudes from an outer surface of the liquid discharge line 420. The flange 462 may have a ring shape while surrounding the liquid discharge line 420. The flange 462 is formed in the interior of the gas discharge line 430.

The groove 464 provides a space through which the gas passes. The groove 464 may be formed in a vertical direction of the flange 462. The groove 464 passes through the flange 462 from the upper surface to the lower surface of the flange 462. A plurality of grooves 464 may be provided. As illustrated in FIG. 13, the grooves 464 may be formed to be perpendicular to the flange. Further, as illustrated in FIGS. 14 and 15, the grooves 464 may be formed to be inclined with respect to the flange 462. The grooves 464 may be spirally formed in the flange 462. Referring to FIG. 14, when viewed vertically, the grooves 464 may be formed to be inclined downwards with respect to a vertical direction of the flange 462. Referring to FIG. 15, when viewed horizontally, the grooves 464 may be formed to be inclined from an outer peripheral surface of the flange 462 towards the inside of the flange 462. The grooves 464 may be formed at an equal interval. The gas flows in the gas discharge line 430 below the flange 462 while passing through the grooves 464. The uniform gas is discharged towards the liquid so as not to be biased through the gas discharge holes 450. Accordingly, the droplets may be atomized.

Figure 16:
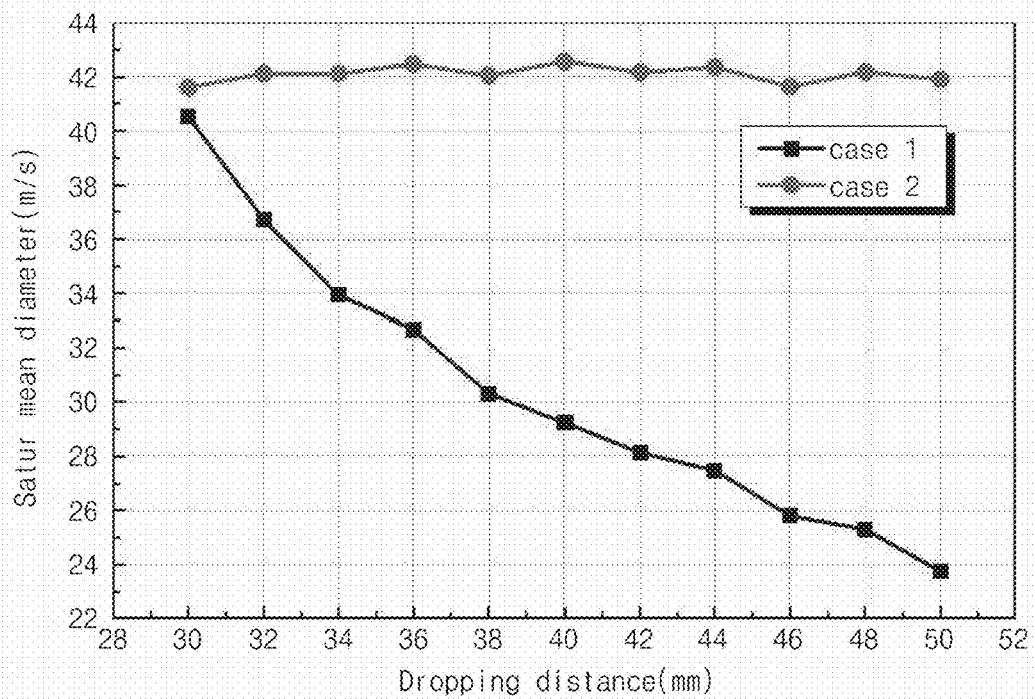
FIG. 16 is a graph depicting SMDs when a groove is vertically formed and when a groove is inclined downwards.
Figure 17:
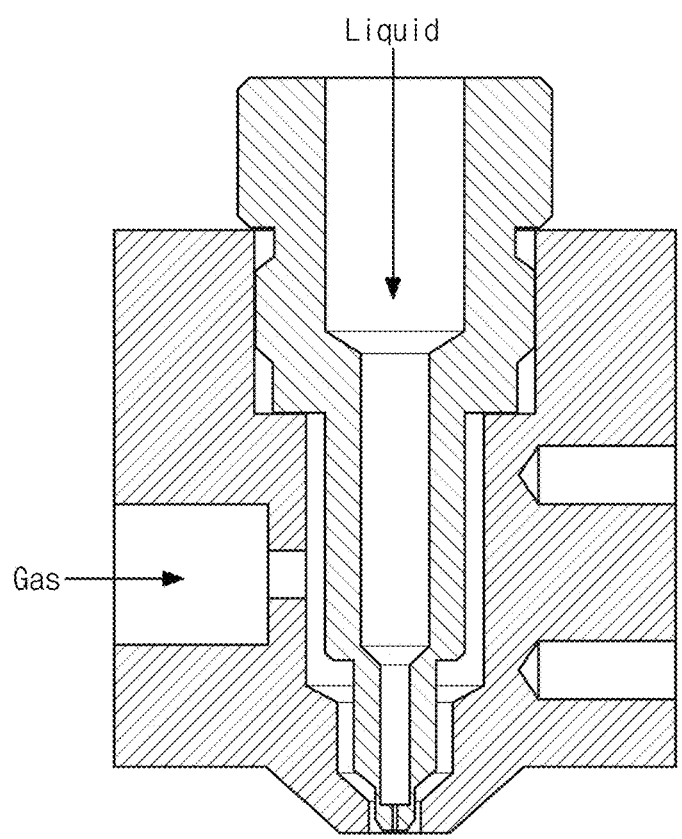
FIGS. 17 and 18 illustrate a two-fluid nozzle according to the prior art.
Figure 18:
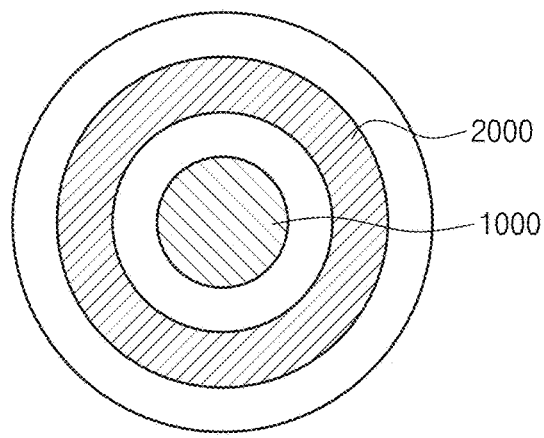

FIG. 16 is a graph depicting a comparison of SMDs when the grooves 464 are inclined downwards (case 1) and when the grooves 464 are formed vertically (case 2). Referring to FIG. 16, when the grooves 464 are vertically formed (case 2), the SMD is 42 μm. Meanwhile, when the grooves 464 are inclined downwards (case 1), the SMD is 24 μm to 40 μm according to the dropping distance. Accordingly, the droplets may be atomized. The cleaning efficiency can be improved without damaging a pattern of the substrate.

In the following, a process of treating a substrate by the nozzle 400 of the substrate treating apparatus 300.

A gas and a liquid are discharged through the nozzle 400 of the injection unit 380. The liquid is discharged through a plurality of liquid discharge holes 400. The gas passes through the buffer 460, the inlet line 430, the middle line 434, and the outlet line 436 and is discharged through the gas discharge hole 450. The discharged gas travels in the direction of the liquid dropping towards the plurality of liquid discharge holes 440. The droplets are atomized by the gas and the dropping liquid is reduced. Then, the sizes and dropping speed of the dropping droplets are uniform as compared with the nozzle 400 having a single liquid discharge hole according to the related art. The dropping droplets are supplied onto the substrate to treat the substrate. Accordingly, damage to a pattern of the substrate can be prevented and cleaning efficiency can be increased.

Although the apparatus for cleaning and treating a substrate has been described as an example, the disclosure herein is not limited thereto, but may have a configuration that is the same as or similar to the configuration of an apparatus for cleaning and treating a substrate to be applied to a substrate treating apparatus having a two-fluid nozzle.

Although it has been described that the outer peripheral surface of the outlet line extends in the same direction as the outer peripheral surface of the middle line in the above example, the outer peripheral surface of the outlet line may extend in a direction different from that of the middle line. For example, the outer peripheral surface of the outlet line may be inclined downwards in a direction that faces the central axis of the liquid discharge line. Then, the inclination of the outer peripheral surface of the outlet line may be larger than that of the inner surface of the outlet line. Accordingly, the cross-sectional area of the outlet line may become wider as it goes downwards. Further, the outer peripheral surface of the outlet line may be inclined downwards in a direction that is opposite to the central axis of the liquid discharge line.

Although it has been described that the cross-sectional area of the outlet line becomes wider as it goes downwards in the above example, the cross-sectional area of the outlet line may be constant. Then, the outer surface and the inner surface of the outlet line are inclined at the same inclination with respect to the central axis of the liquid discharge line.

Although it has been described that the nozzle includes a buffer, the buffer may be omitted.

According to an embodiment of the disclosure herein, damage to a pattern of a substrate can be prevented by reducing a dispersion of droplets in a two-fluid nozzle.

According to an embodiment, the cleaning efficiency of a two-fluid nozzle can be improved.

The above description exemplifies the disclosure herein. Furthermore, the above-mentioned contents describe the exemplary embodiment of the disclosure herein, and the disclosure herein may be used in various other combinations, changes, and environments. That is, the disclosure herein can be modified and corrected without departing from the scope of the disclosure herein that is disclosed in the specification, the equivalent scope to the written disclosures, and/or the technical or knowledge range of those skilled in the art. The written embodiment describes the best state for implementing the technical spirit of the disclosure herein, and various changes required in the detailed application fields and purposes of the disclosure herein can be made. Accordingly, the detailed description of the disclosure herein is not intended to restrict the disclosure herein in the disclosed embodiment state. Furthermore, it should be construed that the attached claims include other embodiments.

What is claimed is:

1. A nozzle for supplying a fluid to a substrate, the nozzle comprising:
   a body having a liquid discharge line for flow of liquid therethrough and a gas discharge line that surrounds the liquid discharge line for flow of a gas therethrough,
   wherein the body comprises:
      a plurality of liquid discharge holes for discharge of liquid flow through the liquid discharge line; and
      a gas discharge hole for discharge of gas flow through the gas discharge line,
   wherein the liquid discharge holes are arranged to surround a central axis of the liquid discharge line,
   wherein the liquid discharge holes are parallel to the central axis of the liquid discharge line,
   wherein the gas discharge line comprises an outlet line through which the gas is discharged to the outside, wherein a cross-sectional area of the outlet line becomes wider as the outlet line extends downwards and
   wherein the outlet line is inclined downwards in a direction that faces the central axis of the liquid discharge line such that the gas is discharged towards the central axis.

2. The nozzle of claim 1, wherein the gas discharge line further comprises:
   an inlet line through which the gas is introduced; and
   a middle line that connects the inlet line and the outlet line,
   wherein the inlet line is inclined downwards in a direction that faces the central axis of the liquid discharge line.

3. The nozzle of claim 2, wherein an outer surface of the outlet line extends parallel to an outer surface of the middle line.

4. The nozzle of claim 1, wherein an inner surface of the outlet line forms an acute angle with respect to the central axis of the liquid discharge line.

5. The nozzle of claim 1, wherein an inner surface of the outlet line forms an angle of 60 to 70 degrees with respect to the central axis of the liquid discharge line.

6. The nozzle of claim 1, wherein an outer surface of the outlet line is parallel to a central axis of the liquid discharge line.

7. The nozzle of claim 1, wherein the liquid discharge holes and the gas discharge hole are spaced apart from each other, and a distance between each of the liquid discharge holes and the gas discharge hole is not more than 0.5 mm.

8. The nozzle of claim 1, wherein a diameter of each of the liquid discharge holes is not more than 500 μm.

9. The nozzle of claim 1, wherein each of the liquid discharge holes has a circular shape, and the gas discharge hole has an annular ring shape.

10. The nozzle of claim 1, further comprising:
    a buffer to prevent gas from being discharged while being biased,
    wherein the buffer comprises:
       a flange that protrudes from an outer surface of the liquid discharge line; and
       a plurality of grooves that are vertically formed along a circumference of the flange, and
    wherein the grooves are inclined from an outer peripheral surface of the flange to an inside of the flange, and inclined downwards with a vertical direction of the flange.

11. An apparatus for treating a substrate, the apparatus comprising:
    a cup providing a treatment space for treating the substrate;
    a support unit disposed in the treatment space to support the substrate in the treatment space; and
    an injection unit that has a nozzle for discharging a fluid to the substrate,
    wherein the nozzle comprises:
       a body having a liquid discharge line through which the liquid flows and a gas discharge line that surrounds the liquid discharge line and through which a gas flows, and
    wherein the body comprises:
       a plurality of liquid discharge holes that discharge the liquid flowing through the liquid discharge line; and
       a gas discharge hole that discharges the gas flowing through the gas discharge line,
       wherein the liquid discharge holes are arranged to surround a central axis of the liquid discharge line,
       wherein the liquid discharge holes are parallel to the central axis of the liquid discharge line,
       wherein the gas discharge line comprises an outlet line through which the gas is discharged to the outside, wherein a cross-sectional area of the outlet line becomes wider as the outlet line extends downwards and
       wherein the outlet line is inclined downwards in a direction that faces the central axis of the liquid discharge line such that the gas is discharged towards the central axis.

12. The apparatus of claim 11, wherein the gas discharge line further comprises:
    an inlet line through which gas can be introduced; and
    a middle line that connects the inlet line and the outlet line,
    wherein the inlet line is inclined downwards in a direction that faces the central axis of the liquid discharge line.

13. The apparatus of claim 12, wherein an outer surface of the outlet line extends parallel to an outer surface of a middle line.

14. The apparatus of claim 11, wherein an inner surface of the outlet line is inclined at an acute angle with respect to a central axis of the liquid discharge line.

15. The apparatus of claim 11, wherein an inner surface of the outlet line forms an angle of 60 to 70 degrees with respect to the central axis of the liquid discharge line to be inclined downwards.

16. The apparatus of claim 11, wherein the outer surface of the outlet line is parallel to the central axis of the liquid discharge line.

17. The apparatus of claim 11, wherein the liquid discharge holes and the gas discharge hole are spaced apart from each other, and a distance between the liquid discharge hole and each of the gas discharge holes is not more than 0.5 mm.

18. The apparatus of claim 11, wherein a diameter of each of the liquid discharge holes is not more than 500 μm.

19. The apparatus of claim 11, wherein each of the liquid discharge holes has a circular shape, and the gas discharge hole has an annular ring shape.

20. The apparatus of claim 11, wherein the nozzle further comprises:
- a buffer to prevent gas from being discharged while being biased, wherein the buffer comprises:
  - a flange that protrudes from an outer surface of the liquid discharge line; and
  - a plurality of grooves that are vertically formed along a circumference of the flange, and
  - wherein the grooves are inclined from an outer peripheral surface of the flange to the inside of the flange, and is inclined downwards with a vertical direction of the flange.

* * * * *